(12) United States Patent
Chuang (10) Patent No.: US 7,929,302 B2
(45) Date of Patent: Apr. 19, 2011

(54) COOLING DEVICE

(75) Inventor: Ping-Yang Chuang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 33 days.

(21) Appl. No.: 12/466,369

(22) Filed: May 14, 2009

(65) Prior Publication Data
US 2010/0246123 A1 Sep. 30, 2010

(30) Foreign Application Priority Data

Mar. 24, 2009 (CN) .......................... 2009 1 0301085

(51) Int. Cl.
*H05K 7/20* (2006.01)

(52) U.S. Cl. .............. 361/695; 361/679.47; 361/679.49; 361/697; 165/121; 165/122

(58) Field of Classification Search ............ 361/679.46–679.49, 679.5, 679.54, 361/690–697, 702–712, 715, 719, 722–727, 361/736, 752; 165/80.3, 104.21, 104.33, 165/121–126, 185; 257/706–727; 454/184; 312/223.2, 223.3, 265, 236
See application file for complete search history.

(56) References Cited

U.S. PATENT DOCUMENTS

| | | | | |
|---|---|---|---|---|
| 5,019,880 A * | 5/1991 | Higgins, III | ................. | 257/714 |
| 5,132,780 A * | 7/1992 | Higgins, III | ................. | 257/722 |
| 5,494,098 A * | 2/1996 | Morosas | ................. | 165/121 |
| 5,504,650 A * | 4/1996 | Katsui et al. | ................. | 361/697 |
| 5,650,912 A * | 7/1997 | Katsui et al. | ................. | 361/697 |
| 5,898,568 A * | 4/1999 | Cheng | ................. | 361/695 |
| 6,104,607 A * | 8/2000 | Behl | ................. | 361/679.49 |
| 6,118,658 A * | 9/2000 | Nakase | ................. | 361/697 |
| 6,137,680 A * | 10/2000 | Kodaira et al. | ................. | 361/697 |
| 6,233,149 B1 * | 5/2001 | Bailey et al. | ................. | 361/704 |
| 6,570,760 B1 * | 5/2003 | Wang | ................. | 361/679.47 |
| 6,659,169 B1 * | 12/2003 | Lopatinsky et al. | ................. | 165/121 |
| 6,684,942 B2 * | 2/2004 | Song et al. | ................. | 165/122 |
| 6,700,781 B2 * | 3/2004 | Chia-Kuan et al. | ................. | 361/697 |
| 6,724,624 B1 * | 4/2004 | Dodson | ................. | 361/695 |
| 6,822,856 B2 * | 11/2004 | Fujiwara | ................. | 361/679.48 |
| 6,885,555 B2 * | 4/2005 | Greco | ................. | 361/695 |
| 6,927,979 B2 * | 8/2005 | Watanabe et al. | ................. | 361/697 |
| 7,165,604 B2 * | 1/2007 | Huang | ................. | 165/121 |
| 7,324,339 B2 * | 1/2008 | Foster et al. | ................. | 361/697 |
| 7,385,816 B1 * | 6/2008 | Foster et al. | ................. | 361/697 |
| 7,391,612 B2 * | 6/2008 | Foster et al. | ................. | 361/697 |
| 7,532,474 B2 * | 5/2009 | Xue et al. | ................. | 361/704 |
| 7,554,805 B2 * | 6/2009 | Liu et al. | ................. | 361/695 |
| 2009/0026813 A1 * | 1/2009 | Lofy | ................. | 297/180.15 |

* cited by examiner

Primary Examiner — Michael V Datskovskiy
(74) Attorney, Agent, or Firm — Zhigang Ma (57) ABSTRACT

A cooling device for dissipating heat for an electronic device includes a shell to absorb heat generating from a heat generating element in the electronic device, and a number of fins. The shell bounds a heat exchanging space and defines an air intake and an air outlet. The number of fins extends into the heat exchanging space. The shell guides air outside the shell to enter into the shell through the air intake and to exit from the shell through the air outlet after exchanging heat in the heat exchanging space.

14 Claims, 8 Drawing Sheets

COOLING DEVICE

CROSS-REFERENCE TO RELATED APPLICATION

The present application is related to a copending U.S. patent application, titled "HEAT DISSIPATION STRUCTURE", with the application Ser. No. 12/436,763, assigned to the same assignee as the present application, the disclosure of which is incorporated herein by reference.

BACKGROUND

1. Technical Field

The disclosure relates to a cooling device for electronic devices.

2. Description of Related Art

Nowadays, the trend for electronic devices, especially computers, is miniaturization, which leads to cooling problems. For example, when cooling a heat generating element, such as a central processing unit, of a notebook computer or a mini desktop computer, two ways are usually used. One way is to employ a traditional fan and heat sink for dissipating heat, which is low-cost but takes up a lot of space. The other way is to employ heat pipes, which are sufficient for cooling, but too expensive.

DETAILED DESCRIPTION

Figure 1:
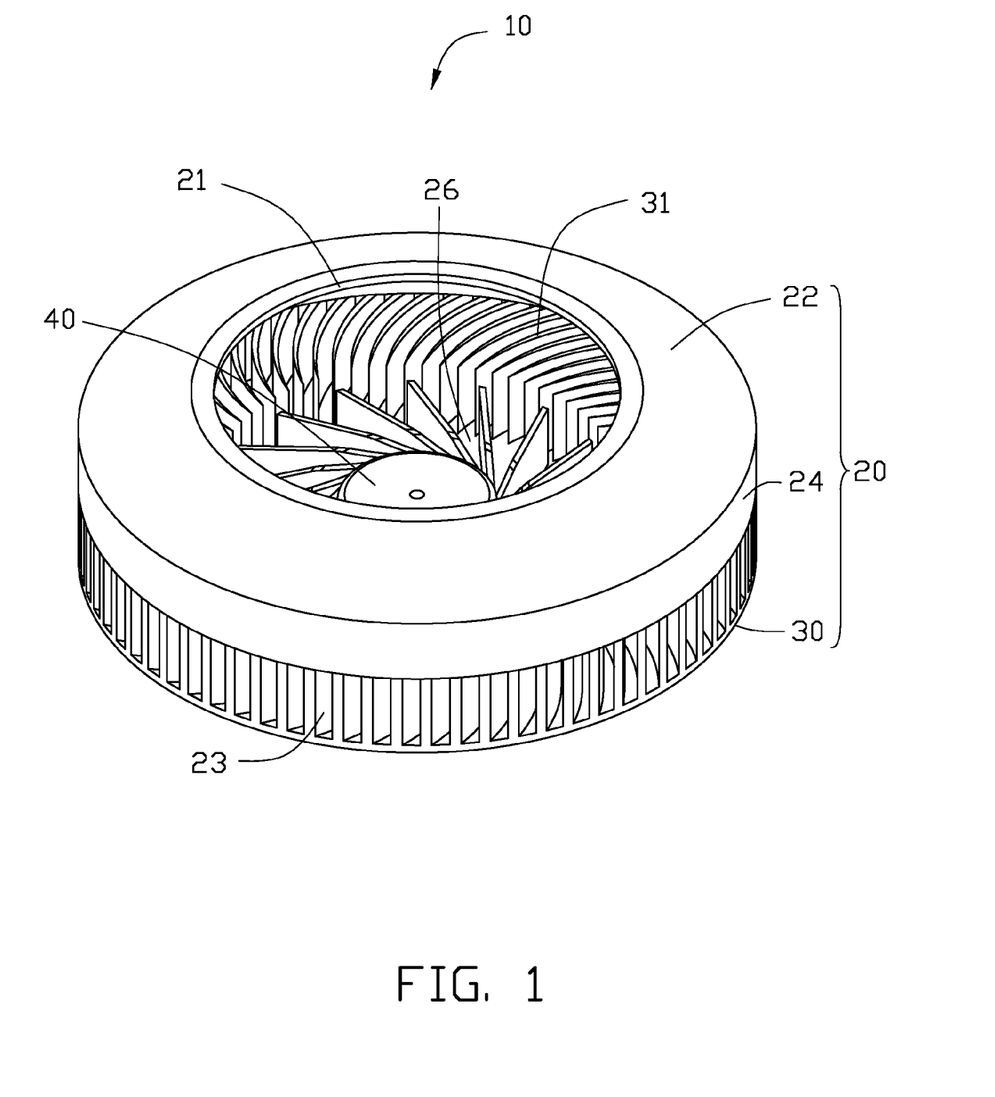
FIG. 1 is an isometric view of a first exemplary embodiment of a cooling device.
Figure 2:
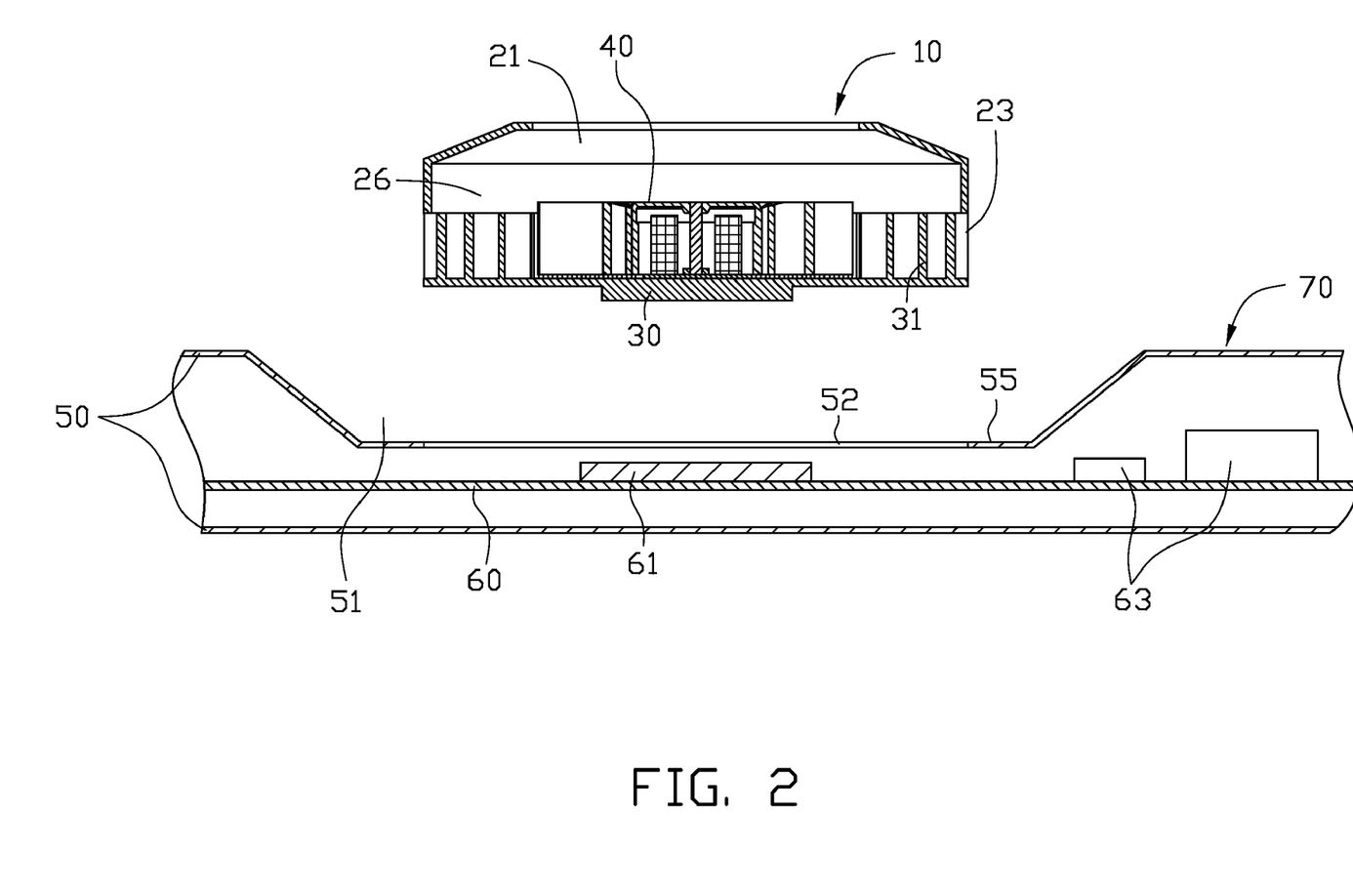
FIG. 2 is a cross-sectional, exploded view of the cooling device in FIG. 1 and an electronic device.
Figure 3:
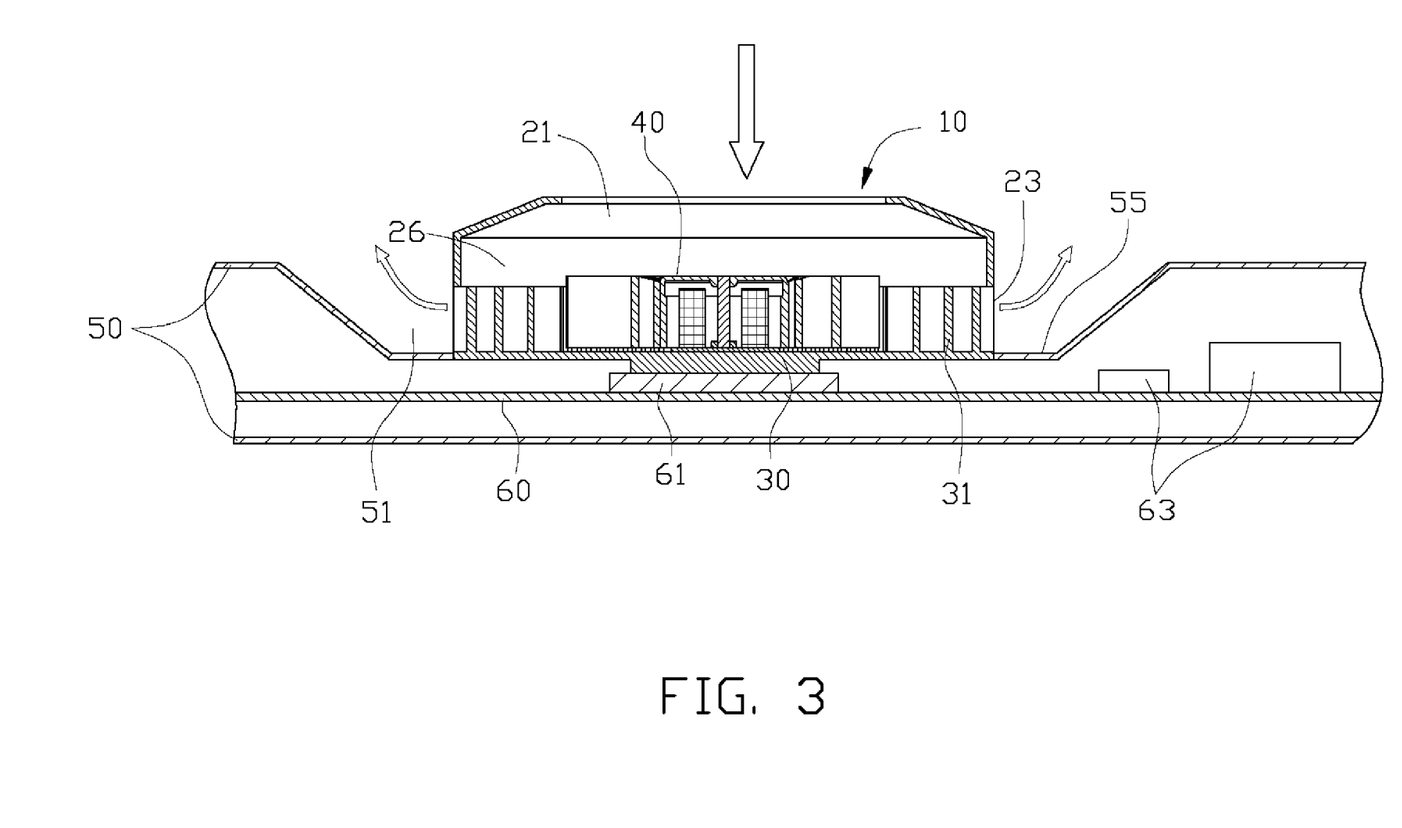
FIG. 3 is an assembled view of the cooling device and the electronic device of FIG. 2.

Referring to FIGS. 1 to 3, a cooling device 10 according to a first embodiment of the present disclosure is used for cooling a first heat generating element 61 of an electronic device 70.

The electronic device 70 includes a housing 50 and a printed circuit board (PCB) 60 mounted in the housing 50. A depressed portion 51 is formed in the housing 50. An opening 52 is defined in a center of a bottom wall 55 of the depressed portion 51. The PCB 60 includes a first heat generating element 61 and a plurality of second heat generating elements 63. In one embodiment, the electronic device 70 is a computer, the PCB 60 is a motherboard, and the first heat generating element 61 is a central processing unit (CPU).

The cooling device 10 includes a generally short cylinder-shaped shell 20, matching the opening 52 of the housing 50 of the electronic device 70. The shell 20 defines a heat exchanging space 26 therein and includes a top board 22, a bottom board 30, and an annular side board 24 perpendicularly connected between edges of the top board 22 and the bottom board 30. The top board 22, the bottom board 30, and the side board 24 bound the heat exchanging space 26. A hole is defined in a center of the top board 22, forming an air intake 21. A plurality of slots is spacedly defined in the side board 24, adjacent to the bottom board 30 to form an air outlet 23. The bottom board 30 touches the first heat generating element 61 to collect heat generated by the heat generating element 61. A plurality of fins 31 extends perpendicularly from the inner side of the bottom board 30 in the shell 20, and radially extends from a center of the shell 20 to the air outlet 23. An eddy current fan 40 is mounted in the shell 20, encircled by the plurality of fins 31.

In assembly, the cooling device 10 is mounted to the electronic device 70 via the opening 52 of the depressed portion 51 of the housing 50. The bottom board 30 of the cooling device 10 abuts against the first heat generating element 61 in the housing 50. The air intake 21 and the air outlet 23 of the cooling device 10 are located outside the housing 50.

In use, the bottom board 30 of the cooling device 10 collects heat generating from the first heat generating element 61 and transfers the heat to the plurality of fins 31. When the fan 40 works, it draws air from outside the housing 50 into the cooling device 10 through the air intake 21. The air then exits from the cooling device 10 through the air outlet 23, taking heat of the plurality of fins 31 directly to the outside of the housing 50 of the electronic device 70.

It is noted that the depressed portion 51 of the housing 50 is designed for reducing overall thickness and beautifying the external appearance of the electronic device 70 mounting the cooling device 10.

In other embodiments, a blade fan may be used to replace the eddy current fan 40.

Figure 4:
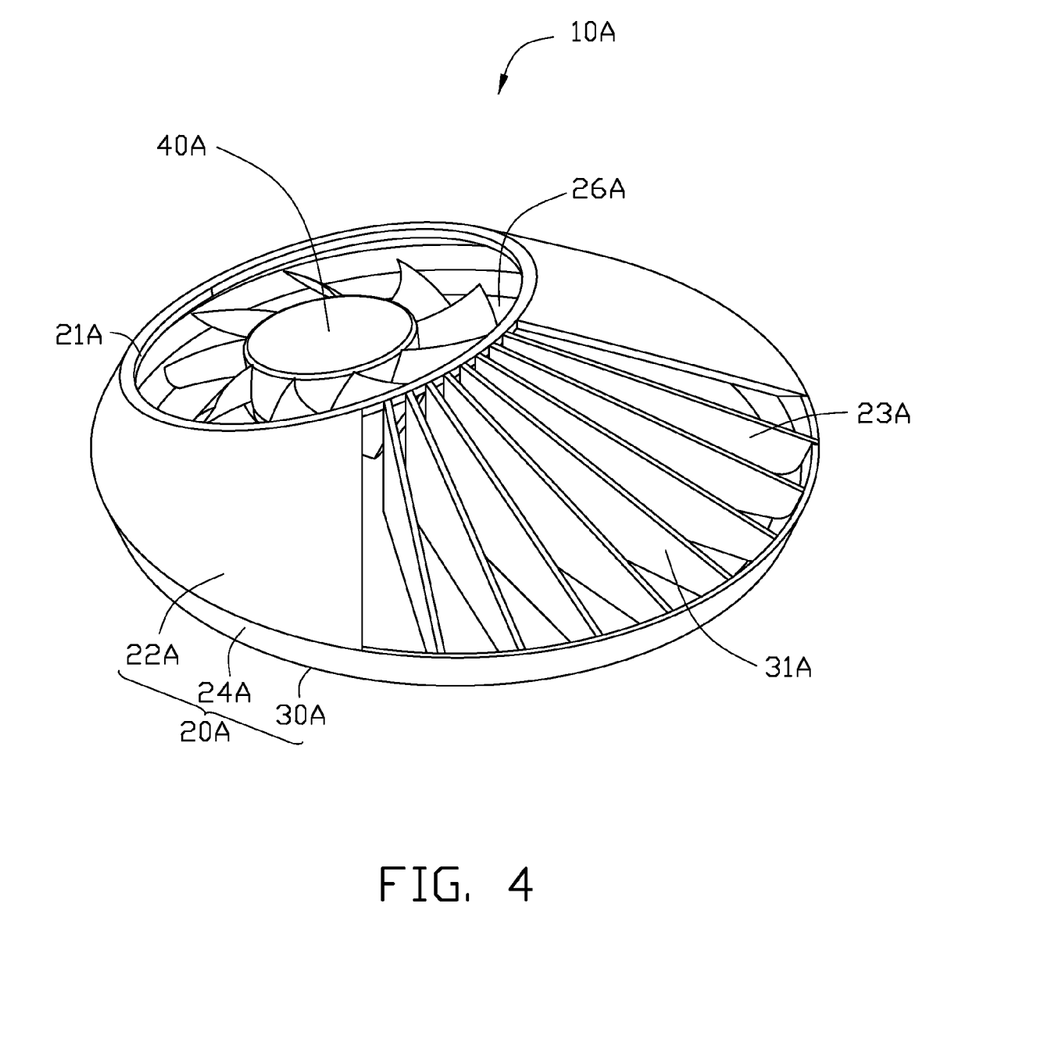
FIG. 4 is an isometric view of a second exemplary embodiment of a cooling device.
Figure 5:
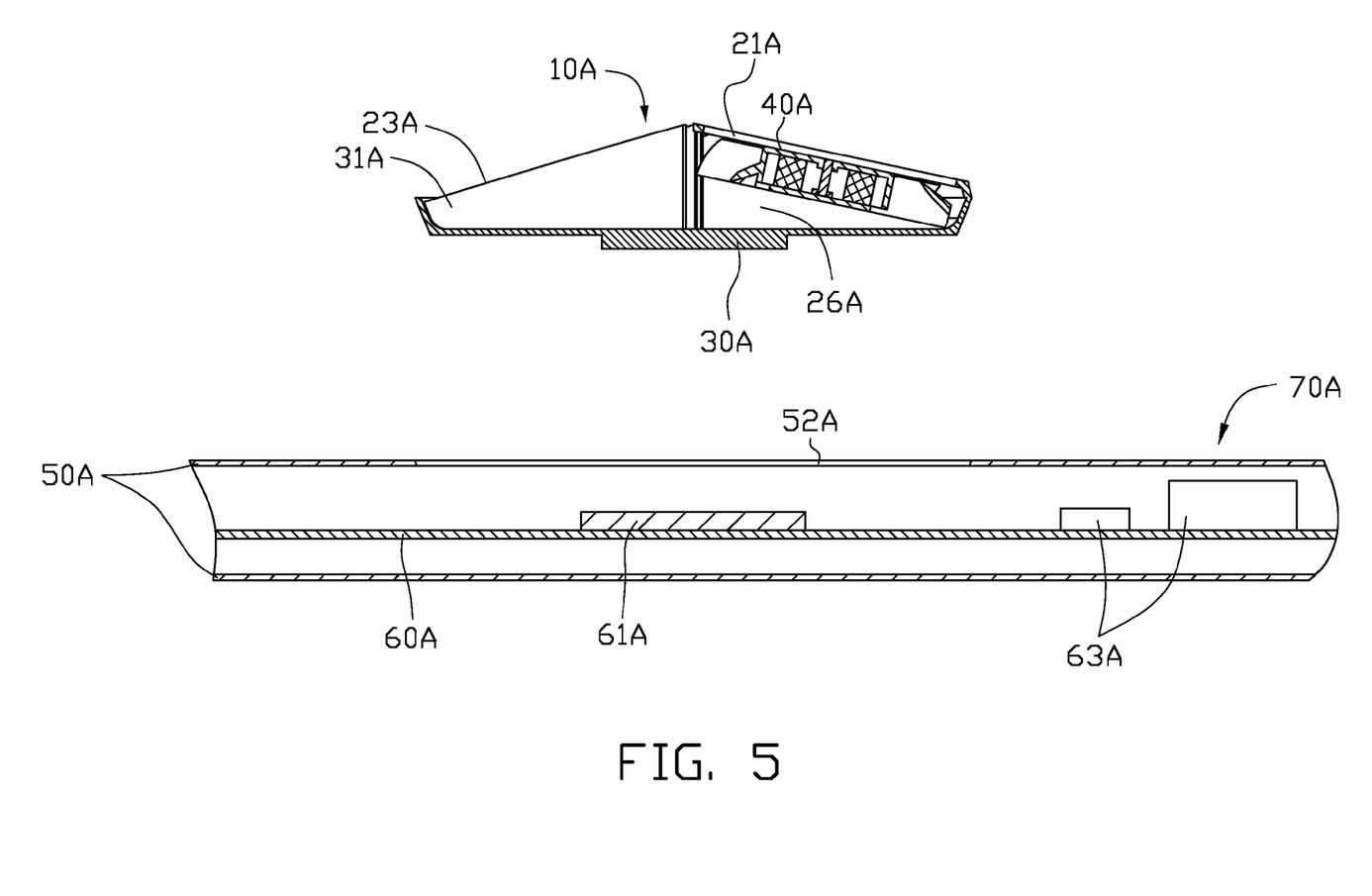
FIG. 5 is a cross-sectional, exploded view of the cooling device in FIG. 4 and an electronic device.
Figure 6:
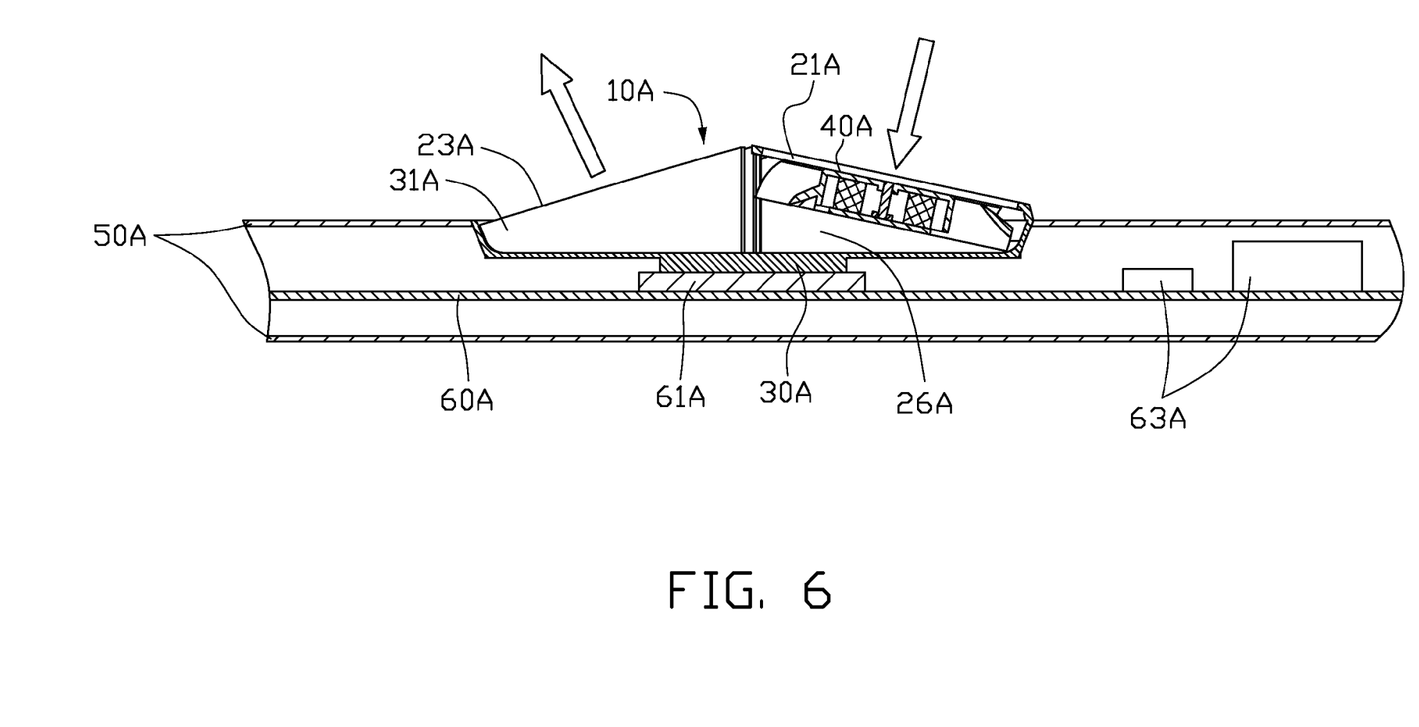
FIG. 6 is an assembled view of the cooling device and the electronic device of FIG. 5.

Referring to FIGS. 4 to 6, a cooling device 10A according to a second embodiment of the present disclosure is used for cooling a first heat generating element 61A of an electronic device 70A.

The electronic device 70A includes a housing 50A and a printed circuit board (PCB) 60A mounted in the housing 50A. An opening 52A is defined in the housing 50A. The PCB 60A includes a first heat generating element 61A and a plurality of second heat generating elements 63A.

The cooling device 10A includes a shell 20A, matching the opening 52A of the housing 50A of the electronic device 70A. The shell 20A defines a heat exchanging space 26A therein and includes a generally tapered top board 22A, a bottom board 30A, and an annular side board 24A connected between edges of the top board 22A and the bottom board 30A. The top board 22A, the bottom board 30A, and the side board 24A bound the heat exchanging space 26A. A hole is defined in a first side of the top board 22A, forming an air intake 21A. A fan-shaped hole is defined in a second side of the top board 22A opposite to the first side, forming an air outlet 23A. The bottom board 30A touches the first heat generating element 61A to collect heat generated by the heat generating element 61A. A plurality of fins 31A in a fan-like arrangement extends perpendicularly from an inner side of the bottom board 30A to the air outlet 23A. A blade fan 40A is mounted in the air intake 21A of the shell 20A.

In assembly, the cooling device 10A is mounted to the electronic device 70A via the opening 52A of the housing 50A. The bottom board 30A of the cooling device 10A abuts against the first heat generating element 61A in the housing 50A. The air intake 21A and the air outlet 23A of the cooling device 10A are located outside the housing 50A.

In use, the bottom board 30A of the cooling device 10A collects heat from the first heat generating element 61A and transfers the heat to the plurality of fins 31A. When the fan 40A works, it draws air from outside the housing 50A into the cooling device 10A through the air intake 21A, and then the air exits from the cooling device 10A through the air outlet 23A, taking heat of the plurality of fins 31A, directly to the outside of the housing 50A of the electronic device 70A.

In other embodiments, an eddy current fan may be used to replace the blade fan 40A.

According to the first and second embodiments, a direct thermal through technology (DTT) is used for the cooling device 10 or 10A to cool the first heat generating element 61 or 61A. In other words, because of the use of the DTT, the cool air does not merely pass through the inside of the housing 50 or 50A, but directly enters into the cooling device 10 or 10A from the outside of the housing 50 or 50A, passes through the cooling device 10 or 10A, and then directly exits to the outside of the housing 50 or 50A. The air intake 21 or 21A and the corresponding air outlet 23 or 23A of the corresponding cooling device 10 or 10A are both located outside the corresponding housing 50 or 50A, thereby avoiding heated air to tarry in the corresponding electronic device 70 or 70A so as to improve heat radiating efficiency.

Figure 7:
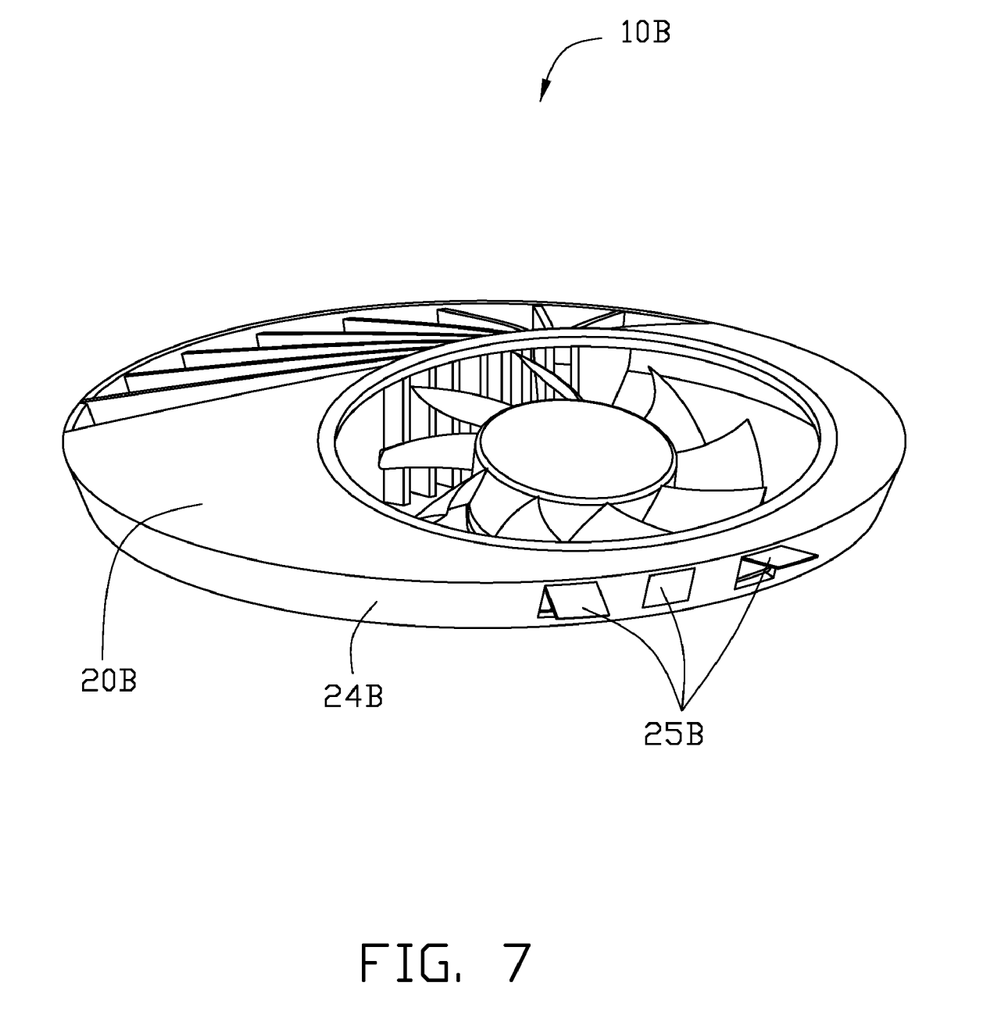
FIG. 7 is an isometric view of a third exemplary embodiment of a cooling device.
Figure 8:
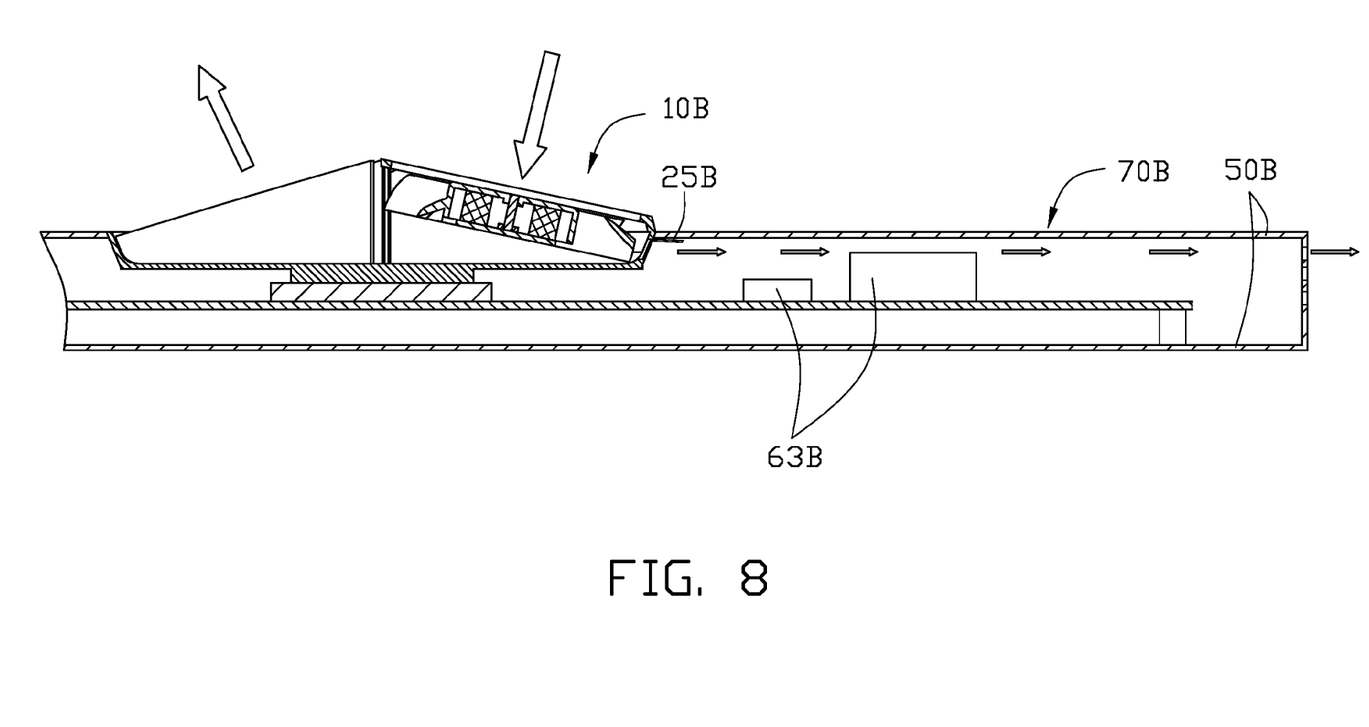
FIG. 8 is a cross-sectional, assembled view of the cooling device in FIG. 7 and an electronic device.

Referring to FIGS. 7 and 8, a cooling device 10B according to a third embodiment of the present disclosure is shown, differing from the second embodiment in FIGS. 4 to 6 only in that a plurality of valves 25B is employed. The plurality of valves 25B is formed on a side board 24B of a shell 20B of the cooling device 10B, inside a housing 50B of an electronic device 70B. Each valve 25B can be controlled to open or close, and an opening degree of the valve 25B can also be adjusted, allowing superfluous air entering into the housing 50B to cool one or more second heat generating elements 63B.

The cooling devices 10, 10A, and 10B of the present disclosure is designed according to the DDT, and provides better than a 50% heat exchange rate thus achieving low cost cooling. The cooling devices 10, 10A, and 10B can be applied to many electronic devices, especially tiny or slim systems, such as notebook computers, mini desktop computers, or liquid crystal displays.

It is to be understood, however, that even though numerous characteristics and advantages of the disclosure have been set forth in the foregoing description, together with details of the structure and function of the invention, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A cooling device for cooling a heat generating element of an electronic device, the electronic device comprising a housing defining an opening, the cooling device comprising:
    a shell bounding a heat exchanging space and to abut against the heat generating element via the opening, wherein an air intake and an air outlet are defined in a portion of the shell located outside the housing;
    a plurality of fins extending from the shell into the heat exchanging space; and
    a fan mounted to the shell to provide airflow;
    wherein the shell guides the airflow to enter into the shell through the air intake, to pass through the heat exchanging space, and to exit from the shell through the air outlet;
    the shell comprises a top board, a bottom board opposite to the top board, and a side board connected between the top board and the bottom board, wherein the bottom board is to abut against the heat generating element; and
    the cooling device further comprises at least one valve defined in the side board, wherein the at least one valve is formed in a portion of the shell located inside the housing.

2. The cooling device of claim 1, wherein the fan is received in the shell.

3. The cooling device of claim 1, wherein the air intake is defined in the top board, the air outlet is defined in the side board.

4. The cooling device of claim 3, wherein the shell is generally short cylinder-shaped, the air intake is defined in a center of the top board, the air outlet is defined circularly in the side board.

5. The cooling device of claim 4, wherein the fan is received in the shell under the air intake, the plurality of fins extends perpendicularly from the bottom board in the shell and encircling the fan.

6. The cooling device of claim 5, wherein the plurality of fins extend to the air outlet.

7. The cooling device of claim 5, wherein the fan is an eddy current fan.

8. The cooling device of claim 1, wherein the air intake and the air outlet are defined in the top board.

9. The cooling device of claim 8, wherein the top board is generally tapered, the air intake and the air outlet are oppositely defined in the top board.

10. The cooling device of claim 9, wherein the fan is received in the shell under the air intake, the plurality of fins extend perpendicularly from the bottom board to the air outlet.

11. A cooling device for dissipating heat for an electronic device, comprising:
    a shell to absorb heat generating from a heat generating element in the electronic device, wherein the shell bounds a heat exchanging space and defines an air intake and an air outlet; and
    a plurality of fins extending into the heat exchanging space;
    wherein the shell guides air outside the shell to enter into the shell through the air intake and to exit from the shell through the air outlet after exchanging heat in the heat exchanging space;
    the shell comprises a generally tapered top board, a bottom board opposite to the top board, and a side board connected between the top board and the bottom board;
    the top board, the bottom board, and the side board bound the heat exchanging space.

12. The cooling device of claim 11, wherein the air intake and the air outlet are oppositely defined in the top board.

13. The cooling device of claim 11, further comprising a fan received in the shell under the air intake.

14. The cooling device of claim 13, wherein the plurality of fins extends from an inner side of the bottom board to the air outlet.

* * * * *